US010573246B2

(12) United States Patent
Kim et al.

(10) Patent No.: US 10,573,246 B2
(45) Date of Patent: Feb. 25, 2020

(54) GATE DRIVER WITH MULTIPLE STAGES AND DISPLAY DEVICE INCLUDING THE SAME

(71) Applicant: LG Display Co., Ltd., Seoul (KR)

(72) Inventors: Inseop Kim, Paju-si (KR); Kyuhan Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/056,223

(22) Filed: Aug. 6, 2018

(65) Prior Publication Data

US 2019/0180690 A1 Jun. 13, 2019

(30) Foreign Application Priority Data

Dec. 12, 2017 (KR) ........................ 10-2017-0170493

(51) Int. Cl.
| | |
|---|---|
| *G09G 3/20* | (2006.01) |
| *G09G 3/3266* | (2016.01) |
| *H01L 27/32* | (2006.01) |
| *G09G 3/3233* | (2016.01) |
| *G09G 3/3291* | (2016.01) |
| *H01L 27/12* | (2006.01) |

(52) U.S. Cl.
CPC ....... *G09G 3/3266* (2013.01); *H01L 27/3276* (2013.01); *G09G 3/3233* (2013.01); *G09G 3/3291* (2013.01); *G09G 2300/0439* (2013.01); *G09G 2310/0286* (2013.01); *G09G 2310/06* (2013.01); *G09G 2310/08* (2013.01); *H01L 27/124* (2013.01)

(58) Field of Classification Search
CPC .. G09G 3/3266; G09G 3/3233; G09G 3/3291; H01L 27/3276
USPC .......................................................... 345/55
See application file for complete search history.

(56) References Cited

U.S. PATENT DOCUMENTS

| | | | | |
|---|---|---|---|---|
| 2012/0062528 | A1* | 3/2012 | Kimura | ................ G09G 3/3677 345/204 |
| 2014/0313174 | A1* | 10/2014 | Murakami | ........... G09G 3/3674 345/204 |
| 2015/0154928 | A1* | 6/2015 | Abe | ........................ G09G 1/005 345/213 |
| 2017/0154572 | A1* | 6/2017 | Kim | ..................... G09G 3/3233 |
| 2017/0309240 | A1* | 10/2017 | Zhang | ...................... G09G 3/36 |

FOREIGN PATENT DOCUMENTS

| | | |
|---|---|---|
| KR | 20100074933 A | 7/2010 |
| KR | 20120044084 A | 5/2012 |

* cited by examiner

*Primary Examiner* — Jonathan M Blancha
(74) *Attorney, Agent, or Firm* — Fenwick & West LLP

(57) ABSTRACT

A gate driver and a display device including the same are disclosed. The gate driver includes a first side stage including a node QL and a first output unit and outputting a first scan signal of a first phase, and a second side stage including a node QR and a second output unit and outputting a second scan signal of the first phase. The first output unit is connected to the node QL and the node QR, and the second output unit is connected to the node QL and the node QR.

12 Claims, 15 Drawing Sheets

GATE DRIVER WITH MULTIPLE STAGES AND DISPLAY DEVICE INCLUDING THE SAME

CROSS-REFERENCE TO RELATED APPLICATIONS

This application claims priority to Republic of Korea Patent Application No. 10-2017-0170493 filed on Dec. 12, 2017 with the Korean Intellectual Property office, which is incorporated herein by reference in its entirety.

BACKGROUND

Field of Technology

The present disclosure relates to a gate driver and a display device including the same.

Discussion of the Related Art

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages of fast response time, high emission efficiency, high luminance, wide viewing angle, and the like.

An OLED display includes pixels arranged in a matrix and adjusts a luminance of the pixels in accordance with gray levels of image data. Each pixel includes an OLED, a driving thin film transistor (TFT) controlling a driving current flowing in the OLED depending on a gate-to-source voltage of the driving TFT, and switching TFTs programming the gate-to-source voltage of the driving TFT in response to a scan signal. The pixel adjusts a display gray level (or a luminance) with an amount of light emitted by the OLED proportional to the driving current.

The OLED display includes a gate driver generating the scan signals. The gate driver sequentially supplies the scan signals to gate lines. The scan signal is supplied to the switching TFT of each pixel through the gate lines and controls a switching operation of the switching TFT.

SUMMARY

A gate driver may be implemented as a gate shift register including a plurality of stages. Each stage outputs a scan signal at a gate-off voltage or a gate-on voltage depending on a voltage of a node Q and a voltage of a node QB. The scan signal of the gate-off voltage is a signal capable of turning off switching TFTs, and the scan signal of the gate-on voltage is a signal capable of turning on the switching TFTs. The scan signal of the gate-on voltage is output to each stage while the node Q is activated, and the scan signal of the gate-off voltage is output to each stage while the node QB is activated.

The gate driver may be formed in non-display areas on opposite sides of a display panel in a double bank structure. In the gate driver of the double bank structure, a stage (hereinafter referred to as "one side stage") at one side and a stage (hereinafter referred to as "other side stage") at other side, that are positioned opposite each other with a gate line interposed therebetween, generate the same scan signal and supply the scan signal to the gate lines. Supplying the scan signal in a double feeding manner as described above can further reduce a distortion of the scan signal resulting from a load variation, compared to a single feeding manner in which only one side stage supplies the scan signal.

When transistors constituting stages are deteriorated depending on a temperature, driving conditions, etc., an abnormal output may occur. In this instance, considering a connection structure between stages (hereinafter referred to as "both side stages") at both sides of the double bank structure, the abnormal output may occur in not only one side stage that is problematic, but also the other side stage opposite the one side stage and next stages receiving an output of the one side stage and/or the other side stage. This is because the both side stages share the scan signal with each other, and an abnormal output of a previous stage is supplied to a next stage as a carry signal. As a result, even when any one of the stages is defective, the gate driver is unusable, and yield of a display device is reduced.

Accordingly, an object of the present disclosure is to address the above-described and other problems and provide a gate driver capable of reducing an abnormal output by changing a connection structure between stages and a display device including the gate driver.

In one aspect, there is provided a gate driver including a first side stage including a node QL and a first output unit, the first side stage configured to output a scan signal A, and a second side stage including anode QR and a second output unit, the second side stage configured to output a scan signal B having the same phase as the scan signal A, wherein the first output unit is connected to the node QL and the node QR, and the second output unit is connected to the node QL and the node QR.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Figure 1:
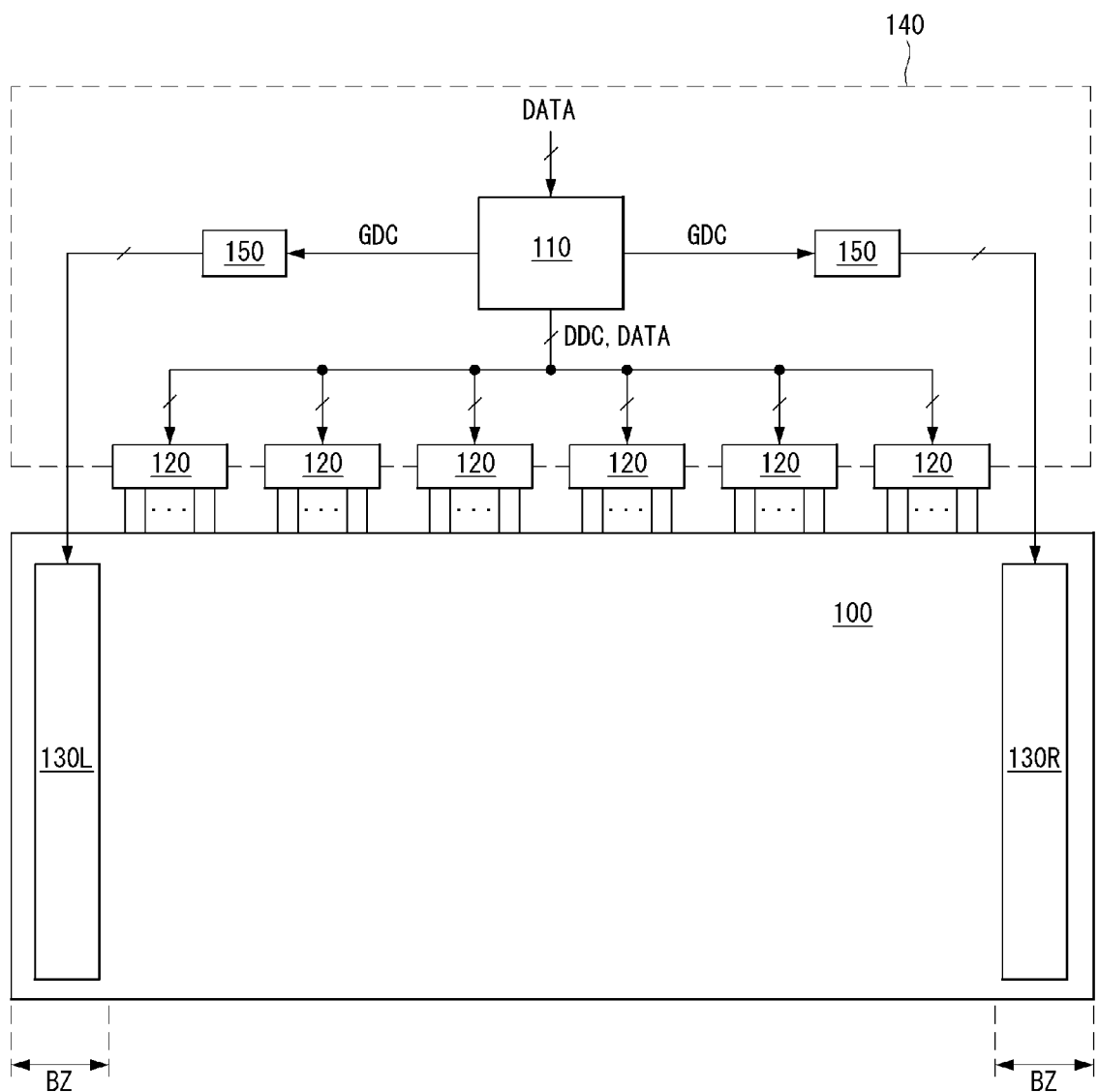
FIG. 1 illustrates a display device according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component, and vice versa, without departing from the scope of the present disclosure.

In embodiments disclosed herein, each of a pixel circuit and a gate driver on a substrate of a display panel may be implemented as transistors of p-type metal oxide semiconductor field effect transistor (MOSFET) structure. However, embodiments are not limited thereto. The transistor is a three-electrode element including a gate, a source, and a drain. The source is an electrode for supplying carriers to the transistor. The carriers inside the transistor begin to flow from the source. The drain is an electrode from which the carriers exit the transistor. Namely, carriers in the MOSFET flow from the source to the drain. In case of a p-type thin film transistor (TFT) (or p-type MOSFET (PMOS)), because carriers are holes, a source voltage is greater than a drain voltage so that holes can flow from a source to a drain. In the p-type TFT, because holes flow from the source to the drain, a current flows from the source to the drain. It should be noted that the source and the drain of the MOSFET are not fixed. For example, the source and the drain of the MOSFET may be changed depending on an applied voltage. Thus, in embodiments disclosed herein, one of the source and the drain is referred to as a first electrode, and the other is referred to as a second electrode.

The following embodiments are described using an organic light emitting diode (OLED) display including an organic light emitting material as an example of a display device. However, it should be noted that the technical idea of the present disclosure is not limited to the OLED display. For example, the present disclosure may be applied to an inorganic electroluminescent display including an inorganic electroluminescent material.

Figure 2:
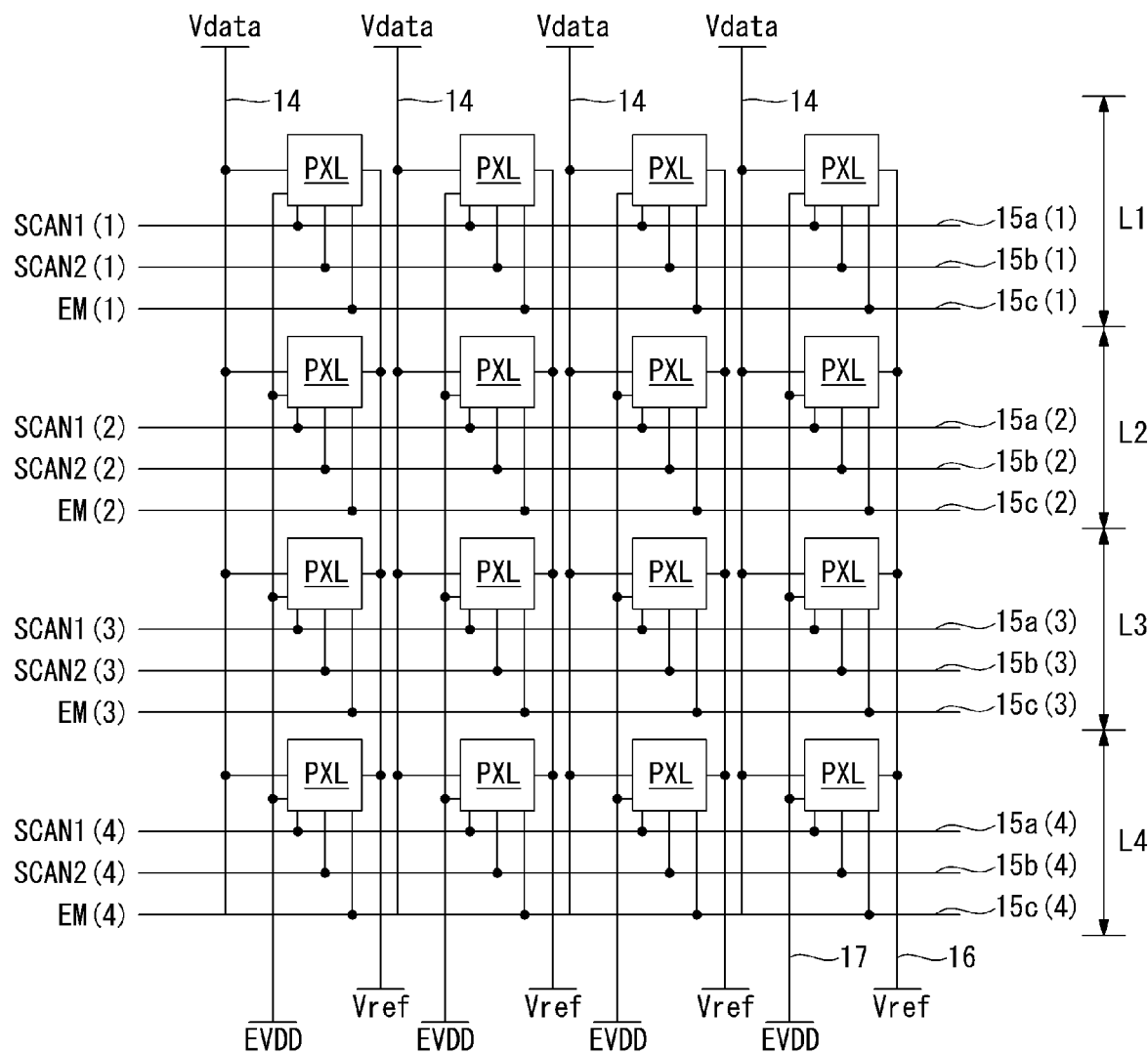
FIG. 2 illustrates a pixel array included in a display panel shown in FIG. 1, according to an embodiment of the disclosure.
Figure 3:
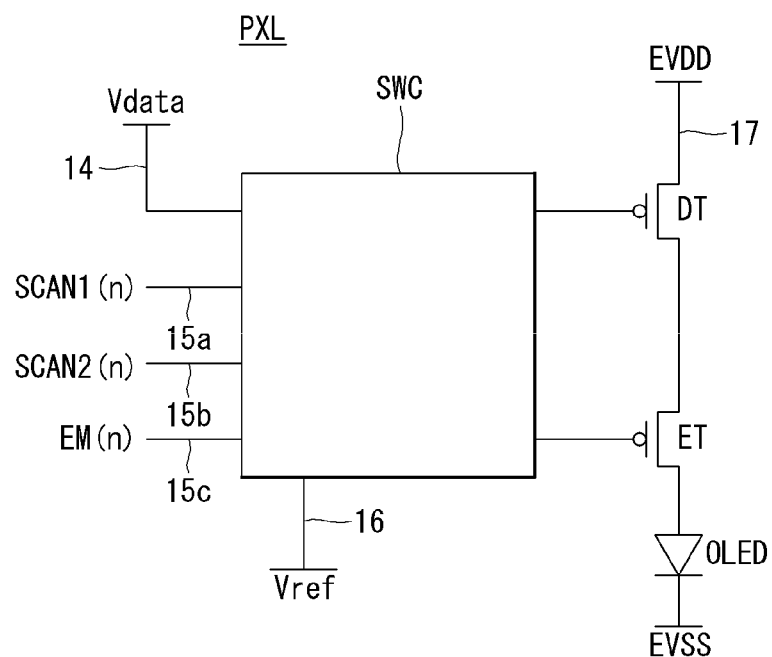
FIG. 3 schematically illustrates a pixel circuit included in an n-th horizontal pixel line shown in FIG. 2, according to an embodiment of the disclosure.
Figure 4:
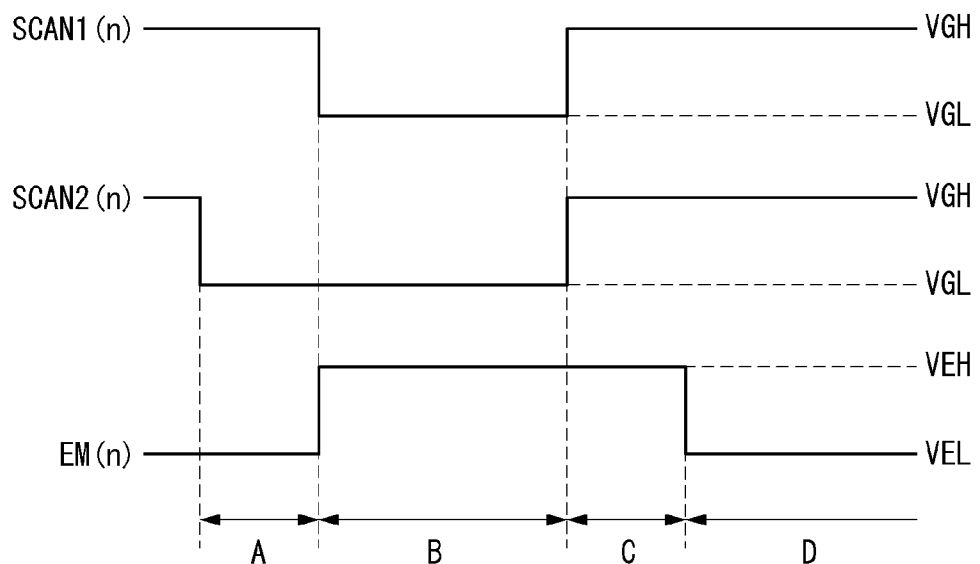
FIG. 4 illustrates a gate signal applied to a pixel circuit shown in FIG. 3, according to an embodiment of the disclosure.
Figure 5:
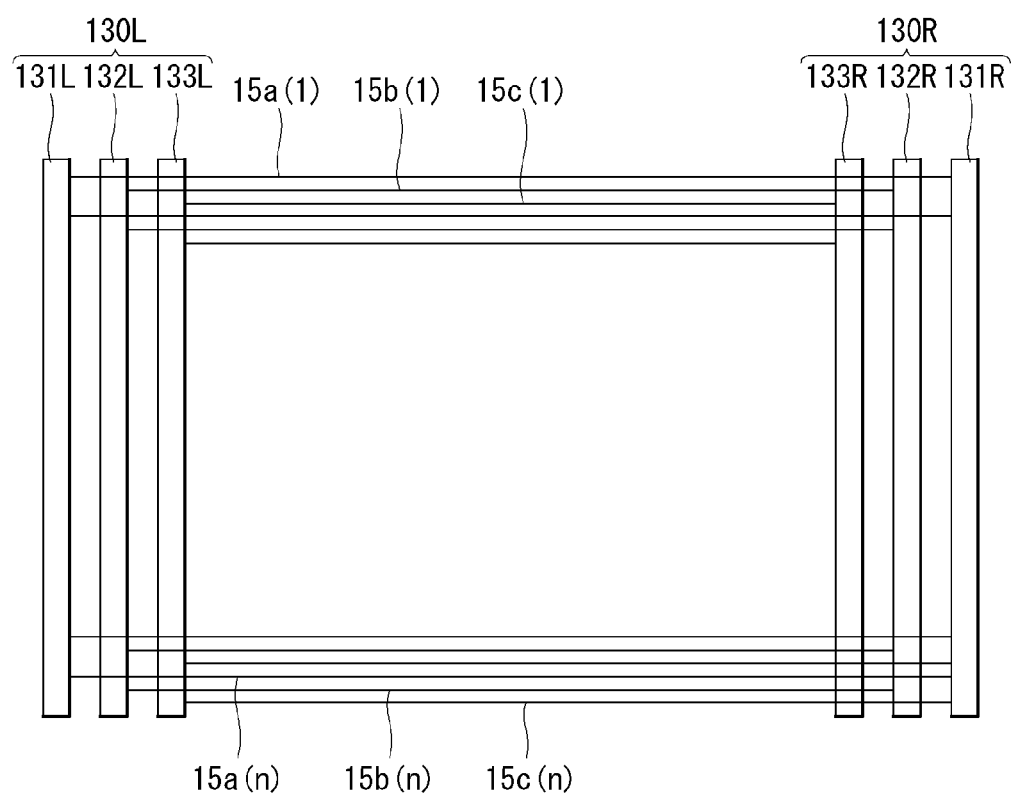
FIG. 5 illustrates first and second scan drivers and an emission driver included in a gate driver shown in FIG. 1, according to an embodiment of the disclosure.

FIG. 1 illustrates a display device according to an embodiment of the disclosure. FIG. 2 illustrates a pixel array included in a display panel shown in FIG. 1. FIG. 3 schematically illustrates a pixel circuit included in an n-th horizontal pixel line shown in FIG. 2. FIG. 4 illustrates a gate signal applied to a pixel circuit shown in FIG. 3. FIG. 5 illustrates first and second scan drivers and an emission driver included in a gate driver shown in FIG. 1.

Referring to FIG. 1, a display device according to an embodiment of the disclosure includes a display panel 100, a timing controller 110, a data driver 120, gate drivers 130L and 130R, and a level shifter 150, and the like.

A plurality of data lines 14 and a plurality of gate lines 15a, 15b and 15c are disposed to intersect each other on the display panel 100. Pixels PXL are respectively arranged at intersections of the data lines 14 and the gate lines 15a, 15b and 15c in a matrix to form a pixel array.

As shown in FIG. 2, the pixel array of the display panel 100 includes a plurality of horizontal pixel lines L1 to L4. The pixels PXL, which are horizontally adjacent to one another and are commonly connected to the gate lines 15a, 15b and 15c, are disposed on each of the horizontal pixel lines L1 to L4. In embodiments disclosed herein, each of the horizontal pixel lines L1 to L4 is not a physical signal line but a set of pixels implemented by horizontally adjacent pixels PXL of one line. The pixel array may include first power lines 17 supplying a high potential power voltage EVDD to the pixels PXL and second power lines 16 supplying a reference voltage Vref to the pixels PXL. Further, the pixels PXL may be connected to an input terminal of a low potential power voltage EVSS.

As shown in FIG. 2, each gate line may include a first gate line 15a supplied with a first scan signal SCAN1, a second gate line 15b supplied with a second scan signal SCAN2, and a third gate line 15c supplied with an emission signal EM. The third gate line 15c may be omitted depending on a structure of the pixels PXL.

Each pixel PXL may be one of a red pixel, a green pixel, a blue pixel, and a white pixel. A red pixel, a green pixel, a blue pixel, and a white pixel may constitute a unit pixel and can implement various colors. A color implemented by the unit pixel may be determined depending on an emission rate of the red pixel, the green pixel, the blue pixel, and the white pixel. The white pixel may be omitted. In this instance, the red pixel, the green pixel, and the blue pixel may constitute a unit pixel. Each pixel PXL may be connected to the data line 14, the first gate line 15a, the second gate line 15b, the third gate line 15c, the first power line 17, the second power line 16, and the like.

As shown in FIG. 3, each pixel PXL may include an organic light emitting diode (OLED), a driving thin film transistor (TFT) DT controlling a driving current flowing in the OLED depending on a gate-to-source voltage of the driving TFT DT, and a switch circuit SWC for programming the gate-to-source voltage of the driving TFT DT. Each pixel PXL may further include an emission TFT ET which is turned on and off in response to the emission signal EM and determines emission timing of the OLED, if necessary or desired. The switch circuit SWC may include a plurality of switching TFTs, one or more capacitors, and the like. Configuration of the switch circuit SWC can be variously modified according to model and specification of the product. The TFTs included in each pixel PXL may be implemented as PMOS low-temperature polycrystalline silicon (LTPS) TFTs, and thus each pixel PXL can secure desired response characteristics through the PMOS LTPS TFTs. However, embodiments are not limited thereto. For example, at least one of the TFTs may be implemented as an NMOS oxide TFT having good off-current characteristics, and other TFTs may be implemented as PMOS LTPS TFTs having good response characteristics.

For example, each pixel PXL may be driven in response to a gate signal shown in FIG. 4. In this instance, each pixel PXL may perform an initialization operation, a sampling operation, a holding operation, and an emission operation in response to the first and second scan signals SCAN1(n) and SCAN2(n) and the emission signal EM(n). In an initialization period A, the first scan signal SCAN1(n) is output at a gate-off voltage VGH, the second scan signal SCAN2(n) is output at a gate-on voltage VGL, and the emission signal EM(n) is output at a gate-on voltage VEL. In a sampling period B, the first and second scan signals SCAN1(n) and SCAN2(n) are output at the gate-on voltage VGL, and the emission signal EM(n) is output at a gate-off voltage VEH. In a holding period C, the first and second scan signals SCAN1(n) and SCAN2(n) and the emission signal EM(n) are output at the gate-off voltages VGH and VEH. In an emission period D, the first and second scan signals SCAN1(n) and SCAN2(n) are output at the gate-off voltage VGH, and the emission signal EM(n) is output at the gate-on voltage VEL.

During the initialization period A, the switch circuit SWC can initialize specific nodes of the pixel circuit to a reference voltage Vref in response to the second scan signal SCAN2(n) of the gate-on voltage VGL, in order to secure operation stability. During the sampling period B, the switch circuit SWC can program the gate-to-source voltage of the driving TFT DT based on a data voltage Vdata in response to the first scan signal SCAN1(n) of the gate-on voltage VGL. Further, during the sampling period B, the switch circuit SWC can sample a threshold voltage of the driving TFT DT in response to the second scan signal SCAN2(n) of the gate-on voltage VGL and reflect the sampled threshold voltage to the gate-to-source voltage of the driving TFT DT, thereby compensating for change in the threshold voltage of the driving TFT DT. During the holding period C, the gate-to-source voltage of the driving TFT DT set in the sampling period B is held. During the emission period D, a driving current corresponding to the gate-to-source voltage flows between a source and a drain of the driving TFT DT, and the OLED emits light with the driving current. In this instance, the emission TFT ET may be turned on in response to the emission signal EM(n) of the gate-on voltage VEL.

In FIG. 4, the gate-on voltage is a voltage of the gate signal capable of turning on the TFT, and the gate-off voltage is a voltage of the gate signal capable of turning off the TFT. For example, a gate-on voltage in the PMOS is gate low voltages VGL and VEL, and a gate-off voltage in the PMOS is gate high voltages VGH and VEH higher than the gate low voltages VGL and VEL. In FIG. 4, the gate-on voltages VGL and VEL may be equal to or different from each other, and the gate-off voltages VGH and VEH may be equal to or different from each other.

Referring to FIG. 1, the data driver 120 receives image data DATA and a source timing control signal DDC from the timing controller 110. The data driver 120 converts the image data DATA into gamma compensation voltages in response to the source timing control signal DDC received from the timing controller 110 and generates data voltages Vdata. The data driver 120 synchronizes the data voltage Vdata with the scan signal SCAN and supplies the data voltage Vdata to the data lines 14 of the display panel 100. The data driver 120 may be connected to the data lines 14 of the display panel 100 through a chip-on glass (COG) process or a tape automated bonding (TAB) process.

Referring to FIG. 1, the level shifter 150 boosts a transistor-transistor logic (TTL) level voltage of a gate timing control signal GDC received from the timing controller 110 to the gate-on voltages VGL and VEL and the gate-off voltages VGH and VEH capable of driving the TFTs of the display panel 100 and supplies them to the gate drivers 130L and 130R. The gate timing control signal GDC may include a start signal, a clock signal, and the like.

Referring to FIG. 1, the gate drivers 130L and 130R operate in response to the gate timing control signal GDC received from the level shifter 150 and generate the gate signals. The gate drivers 130L and 130R sequentially supply the gate signals to the gate lines. The gate drivers 130L and 130R may be directly formed on a lower substrate of the display panel 100 using a gate driver-in panel (GIP) manner. The gate drivers 130L and 130R may be formed in a non-display area (i.e., a bezel area BZ) outside a screen of the display panel 100. In the GIP manner, the level shifter 150 may be mounted on a printed circuit board (PCB) 140 together with the timing controller 110.

As shown in FIG. 5, the gate drivers 130L and 130R are disposed on opposite sides of the display panel 100 in a double bank structure and supply the scan signals in a double feeding manner, thereby reducing signal distortion resulting from a load variation of each gate line. The gate drivers 130L and 130R include first scan drivers 131L and 131R generating the first scan signal SCAN1, second scan drivers 132L and 132R generating the second scan signal SCAN2, and emission drivers 133L and 133R generating the emission signal EM.

Figure 7:
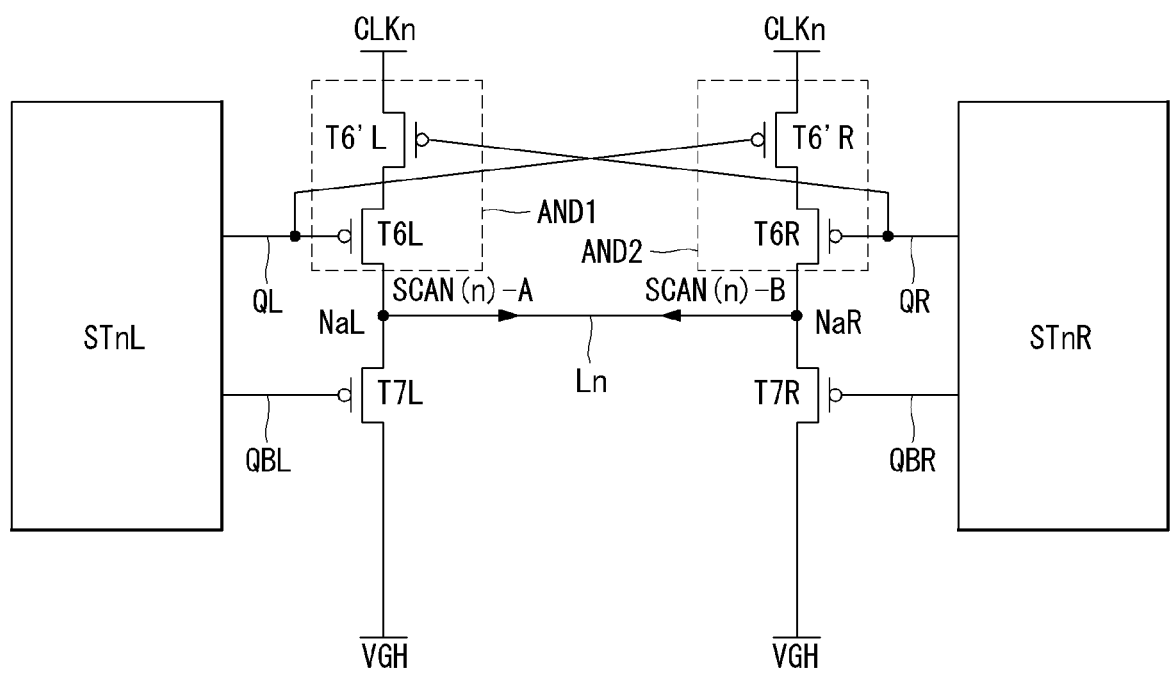
FIG. 7 illustrate output units of stages at both sides, in a gate shift register shown in FIG. 6, that supply scan signals having same phase in a double feeding manner, according to an embodiment of the disclosure.

The first scan drivers 131L and 131R may supply the first scan signals SCAN1(1~n) to first gate lines 15a(1) to 15a(n) in a line sequential manner. The second scan drivers 132L and 132R may supply the second scan signals SCAN2(1~n) to second gate lines 15b(1) to 15b(n) in a line sequential manner. The emission drivers 133L and 133R may supply the emission signals EM(1~n) to third gate lines 15c(1) to 15c(n) in a line sequential manner. Each of the first and second scan drivers may be implemented as a gate shift register including a plurality of stages (hereinafter referred to as "both side stages") at both sides. Each of the plurality of both-side stages may have connection configuration of first and second output units as shown in FIG. 7, so that an abnormal output can be reduced.

Referring to FIG. 1, the timing controller 110 may be connected to an external host system through known various interface manners. The timing controller 110 receives the image data DATA from the host system. The timing controller 110 may correct the image data DATA and then transmit the corrected image data DATA to the data driver 120, so that a luminance variation resulting from a difference between electrical characteristics of the pixels PXL is compensated.

The timing controller 110 receives timing signals such as a vertical sync signal Vsync, a horizontal sync signal Hsync, a data enable signal DE, and a main clock MCLK from the host system. The timing controller 110 may generate the gate timing control signal GDC and the source timing control signal DDC based on the timing signals.

Figure 6:
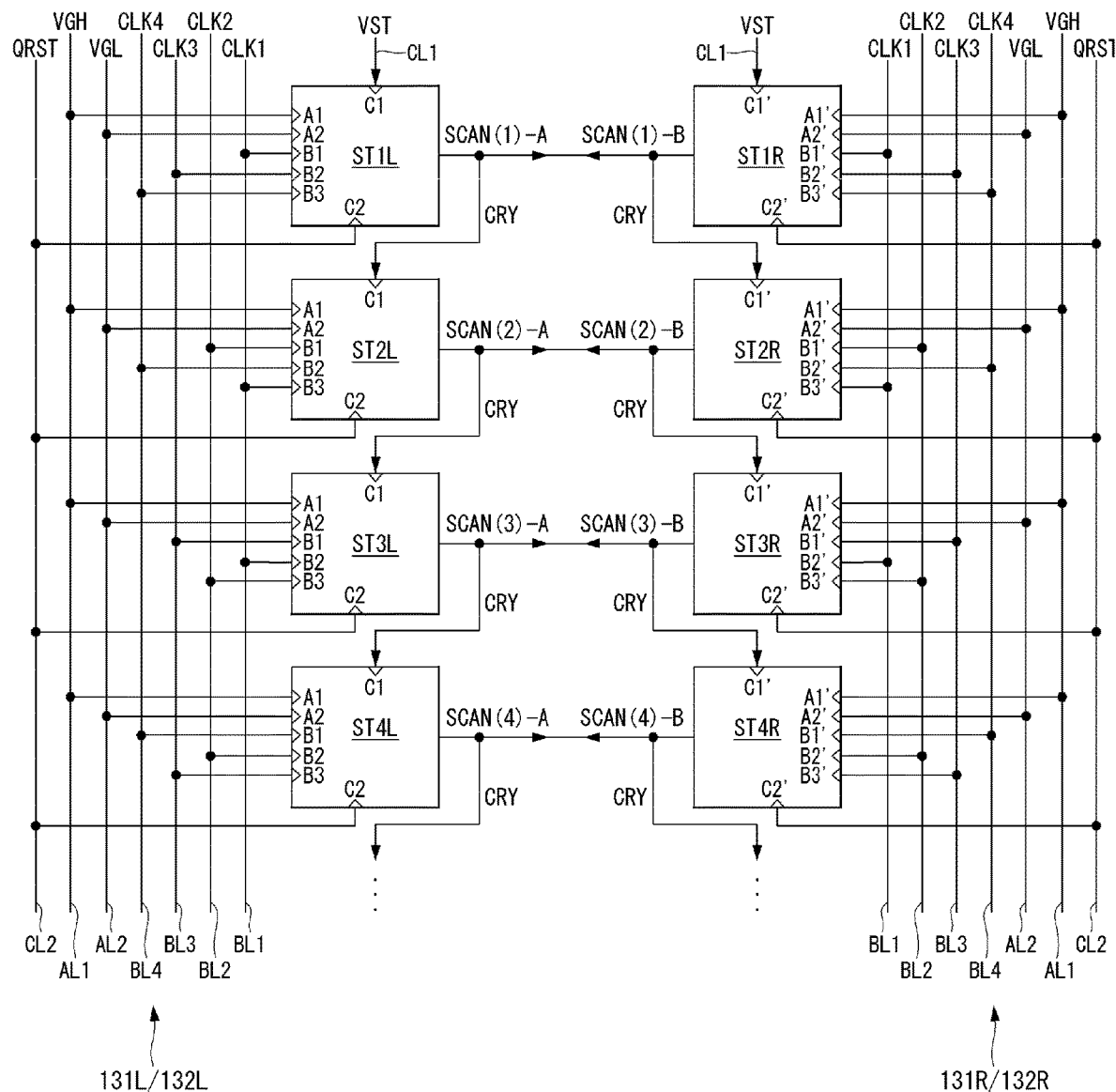
FIG. 6 illustrates that a gate shift register included in a first scan driver or a second scan driver shown in FIG. 5 is configured in a double bank structure, according to an embodiment of the disclosure.

FIG. 6 illustrates that a gate shift register included in the first scan driver or the second scan driver shown in FIG. 5 is configured in a double bank structure. FIG. 7 illustrate output units of both side stages, in the gate shift register shown in FIG. 6, that supply the same scan signal in a double feeding manner.

The first scan drivers 131L and 131R and the second scan drivers 132L and 132R shown in FIG. 5 are configured in the double bank structure as shown in FIG. 6. Namely, stages (hereinafter referred to as "first side stages") ST1L to ST4L at a first side (for example, upper, lower, left, or right side) and stages (hereinafter referred to as "second side stages") ST1R to ST4R at a second side opposite the first side are disposed opposite each other with the gate lines interposed therebetween in accordance with the double bank structure. The first side stages ST1L to ST4L and the second side stages ST1R to ST4R are GIP elements directly formed on the display panel 100. In embodiments disclosed herein, both side stages include the first side stage and the second stage.

Operations of the first side stages ST1L to ST4L are sequentially activated and sequentially output scan signals SCAN(1)-A to SCAN(4)-A. Operations of the second side stages ST1R to ST4R are sequentially activated and sequentially output the scan signals SCAN(1)-B to SCAN(4)-B. A n-th first side stage and a n-th second side stage connected to the same gate line output scan signals SCAN(n)-A and SCAN(n)-B of the same phase. The scan signals SCAN(n)-A and SCAN(n)-B of the same phase may be the first scan signal SCAN1(n) or the second scan signal SCAN2(n) of FIG. 4.

The first side stages ST1L to ST4L and the second side stages ST1R to ST4R of FIG. 6 may have connection configuration of first and second output units AND1 and AND2 as shown in FIG. 7, so that an abnormal output can be reduced. In FIG. 7, a first side stage STnL includes a node QL and a first output unit AND1 and may output a scan signal A SCAN(n)-A of a first phase. Further, a second side stage STnR includes a node QR and a second output unit AND2 and may output a scan signal B SCAN(n)-B of the first phase. In embodiments disclosed herein, the scan signal A SCAN(n)-A of the first phase and the scan signal B SCAN(n)-B of the first phase may be the same.

The first output unit AND1 includes first pull-up elements connected to the node QL and the node QR. Thus, the first output unit AND1 outputs the scan signal A SCAN(n)-A at the gate-on voltage within a period in which both the node QL and the node QR are activated. The first output unit AND1 outputs the scan signal A SCAN(n)-A at the gate-off voltage when at least one of the node QL and the node QR is deactivated.

The first pull-up elements of the first output unit AND1 include transistors T6'L and T6L that are connected in series between a first clock input terminal and a first output node NaL. A gate electrode of the transistor T6'L is connected to the node QR, and a gate electrode of the transistor T6L is connected to the node QL. A clock signal CLKn synchronized with the scan signal A SCAN(n)-A is input to a first clock input terminal. The clock signal CLKn may be one of clock signals CLK1 to CLK4 of FIG. 6.

The second output unit AND2 includes second pull-up elements connected to the node QL and the node QR. Thus, the second output unit AND2 outputs the scan signal B SCAN(n)-B at the gate-on voltage within a period in which both the node QL and the node QR are activated. The second output unit AND2 outputs the scan signal B SCAN(n)-B at the gate-off voltage when at least one of the node QL and the node QR is deactivated.

The second pull-up elements of the second output unit AND2 include transistors T6'R and T6R that are connected in series between a second clock input terminal and a second output node NaR. A gate electrode of the transistor T6'R is connected to the node QL, and a gate electrode of the transistor T6R is connected to the node QR. The clock signal CLKn synchronized with the scan signal B SCAN(n)-B is input to a second clock input terminal in the same manner as the first clock input terminal.

The operations of the first side stages ST1L to ST4L and the second side stages ST1R to ST4R of FIG. 6 are activated in response to a start signal VST or a carry signal CRY and sequentially output the scan signals SCAN(1)-A/B to SCAN(4)-A/B. Operations of the uppermost stages ST1L and ST1R are activated in response to the start signal EVST, and operations of the second uppermost stages ST2L and ST2R below the uppermost stages ST1L and ST1R to lowermost stages are sequentially activated in response to the carry signal CRY received from a previous stage. The carry signal CRY is the scan signal of the previous stage. In embodiments disclosed herein, "previous stage" is a stage that is activated earlier than a reference stage and generates a scan signal of which a phase is earlier than a phase of a scan signal output from the reference stage.

The first side stages ST1L to ST4L and the second side stages ST1R to ST4R of FIG. 6 may be commonly connected to a reset line CL2 supplied with a global reset signal QRST and power lines AL1 and AL2 supplied with the gate-off voltage VGH and the gate-on voltage VGL, in order to output the scan signals SCAN(1)-A/B to SCAN(4)-A/B. Further, the first side stages ST1L to ST4L and the second side stages ST1R to ST4R of FIG. 6 may be selectively connected to clock lines BL1 to BL4 supplied with the clock signals CLK1 to CLK4 and may be selectively connected to a start line CL1 supplied with the start signal VST. All of the start signal VST and the clock signals CLK1 to CLK4 swing between the gate-off voltage VGH and the gate-on voltage VGL.

Each of the first side stages ST1L to ST4L may be connected to the signal lines AL1, AL2, BL1 to BL3, CL1 and CL2 through a plurality of connection terminals A1, A2, B1 to B3, C1 and C2. Each of the second side stages ST1R to ST4R may be connected to the signal lines AL1, AL2, BL1 to BL3, CL1 and CL2 through a plurality of connection terminals A1', A2', B1' to B3', C1' and C2'.

Figure 8:
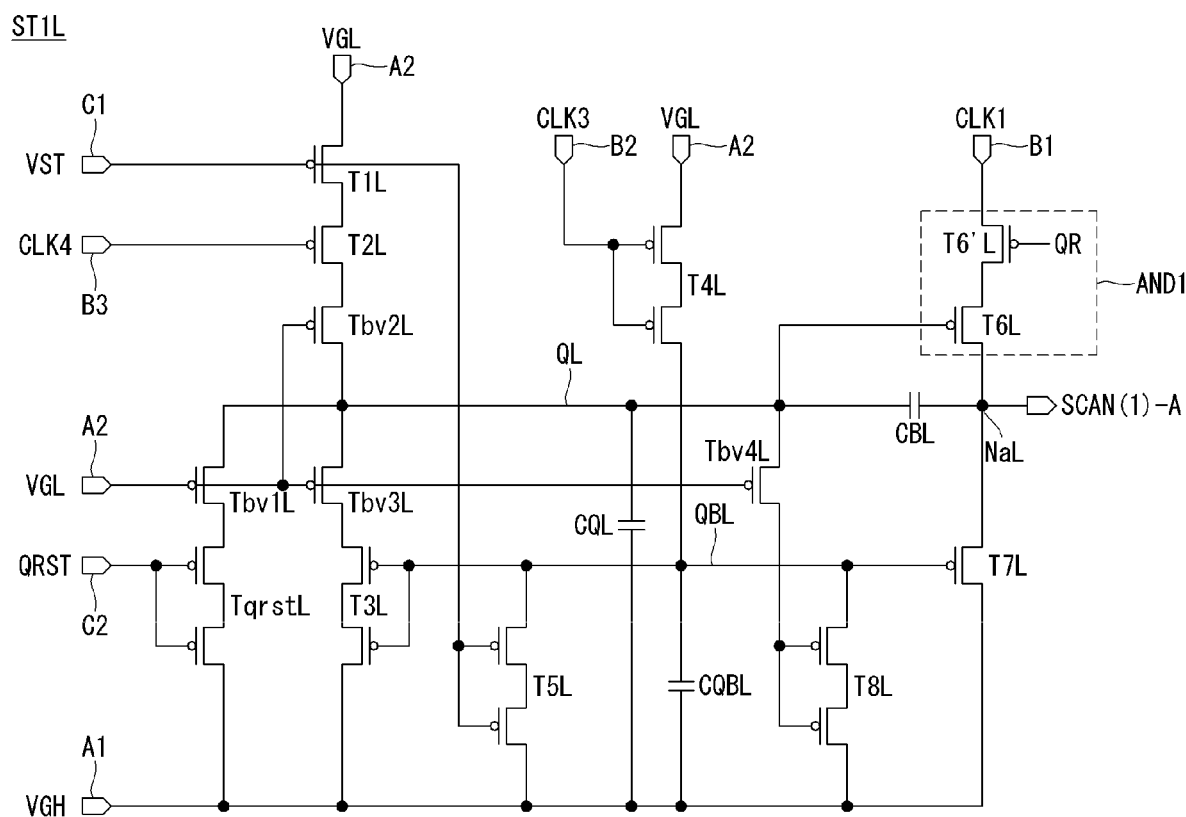
FIG. 8 illustrates configuration of a first side stage including a first output unit shown in FIG. 7, according to an embodiment of the disclosure.

FIG. 8 illustrates configuration of a first side stage including the first output unit shown in FIG. 7. The first side stage shown in FIG. 8 is the stage ST1L shown in FIG. 6. Configuration of each of the remaining first side stages ST2L, ST3L, ST4L of FIG. 6 may be substantially the same as configuration of the stage ST1L of FIG. 8, except a difference in the clock signals and the carry signal.

Referring to FIG. 8, a first side stage ST1L may include a reset unit, an output buffer, a QL controller, a QBL controller, and a deterioration reducing unit. A first output unit AND1 is included in the output buffer.

The reset unit may be implemented as a transistor TqrstL that is switched in response to the global reset signal QRST. The transistor TqrstL resets the node QL to the gate-off voltage VGH every predetermined time, thereby securing the operation stability and the operation reliability of the stage. A gate electrode of the transistor TqrstL is connected to a reset terminal C2. The global reset signal QRST of the gate-on voltage VGL may be simultaneously input to all the stages in a power-on period of an initial drive. The global reset signal QRST of the gate-on voltage VGL may be input in the initial drive before the start signal VST. When the transistor TqrstL is turned on by the global reset signal QRST of the gate-on voltage VGL, the node QL may be reset to the gate-off voltage VGH.

The output buffer may include the first output unit AND1 including first pull-up elements T6'L and T6L controlled according to the node QL and the node QR, a pull-down element T7L controlled according to a node QBL, and a boosting capacitor CBL connected to the node QL.

The first pull-up elements T6'L and T6L are transistors outputting a scan signal SCAN(1)-A of the gate-on voltage VGL to a node NaL when voltages of the node QL and the node QR are activated in response to the clock signal CLK1 and then are boosted. The first pull-up elements T6'L and T6L include the transistors T6'L and T6L that are connected in series between a clock input terminal B1 and the output node NaL. A gate electrode of the transistor T6'L is connected to the node QR, and a gate electrode of the transistor T6L is connected to the node QL.

The boosting capacitor CBL is connected between the node QL and the node NaL. When the clock signal CLK1 is inverted from the gate-off voltage VGH to the gate-on voltage VGL in a state where the voltage of the node QL is at the gate-on voltage VGL, the voltage of the node QL is reduced from the gate-on voltage VGL to a boosting voltage level lower than the gate-on voltage VGL due to a coupling effect of the boosting capacitor CBL and the node QL. Due to such a bootstrapping effect, a voltage of the node NaL is rapidly changed to the gate-on voltage VGL. The scan signal SCAN(1)-A of the gate-on voltage VGL can be rapidly output using the bootstrapping effect without the distortion or the delay.

The pull-down element T7L is a transistor outputting the scan signal SCAN(1)-A of the gate-off voltage VGH to the node NaL when the node QBL is activated. A gate electrode of the pull-down element T7L is connected to the node QBL, a first electrode of the pull-down element T7L is connected to the node NaL, and a second electrode of the pull-down element T7L is connected to a VGH power terminal A1.

The QL controller may include transistors T1L, T2L and T3L controlling the voltage of the node QL and a capacitor CQL.

The transistors T1L and T2L are connected in series between a VGL power terminal A2 and the node QL. The transistors T1L and T2L are switched in response to the start signal VST and the clock signal CLK4, each of which has a phase earlier than a phase of the clock signal CLK1, and activate the node QL to the gate-on voltage VGL. A gate electrode of the transistor T1L is connected to a start terminal C1 to which the start signal VST is input, a first electrode of the transistor T1L is connected to the VGL power terminal A2, and a second electrode of the transistor T1L is connected to a first electrode of the transistor T2L. A gate electrode of the transistor T2L is connected to a clock terminal B3 to which the clock signal CLK4 is input, the first electrode of the transistor T2L is connected to the second electrode of the transistor T1L, and a second electrode of the transistor T2L is connected to the node QL via a transistor Tbv2L.

The transistor T3L deactivates the node QL to the gate-off voltage VGH while the node QBL is activated. A gate electrode of the transistor T3L is connected to the node QBL, a first electrode of the transistor T3L is connected to the VGH power terminal A1, and a second electrode of the transistor T3L is connected to the node QL via a transistor Tbv3L.

The capacitor CQL is connected between the QL and the VGH power terminal A1 and stabilizes the voltage of the node QL while the node QL is floated.

The QBL controller may include transistors T4L, T5L and T8L controlling a voltage of the node QBL and a capacitor CQBL.

The transistor T4L is switched in response to the clock signal CLK3, of which a phase is later than the phase of the clock signal CLK1, and activates the node QBL to the gate-on voltage VGL. A gate electrode of the transistor T4L is connected to a clock terminal B2 to which the clock signal CLK3 is input, a first electrode of the transistor T4L is connected to the VGL power terminal A2, and a second electrode of the transistor T4L is connected to the node QBL.

The transistor T5L is switched in response to the start signal VST and deactivates the node QBL to the gate-off voltage VGH. A gate electrode of the transistor T5L is connected to the start terminal C1, a first electrode of the transistor T5L is connected to the VGH power terminal A1, and a second electrode of the transistor T5L is connected to the node QBL.

The transistor T8L deactivates the node QBL to the gate-off voltage VGH while the node QL is activated. A gate electrode of the transistor T8L is connected to the node QL via a transistor Tbv4L, a first electrode of the transistor T8L is connected to the VGH power terminal A1, and a second electrode of the transistor T8L is connected to the node QBL.

The capacitor CQBL is connected between the node QBL and the VGH power terminal A1 and stabilizes the voltage of the node QBL while the node QBL is floated.

The deterioration reducing unit includes transistors Tbv1L, Tbv2L, Tbv3L and Tbv4L of which gate electrodes are connected to the VGL power terminal A2. One electrode of each of the transistors Tbv1L, Tbv2L, Tbv3L and Tbv4L is connected to the node QL. The transistors Tbv1L, Tbv2L, Tbv3L and Tbv4L maintain a turn-on state due to the gate-on voltage VGL of the VGL power terminal A2. However, because a gate-to-source voltage of each of the transistors Tbv1L, Tbv2L, Tbv3L and Tbv4L is less than a threshold voltage while the voltage of the node QL is boosted, the transistors Tbv1L, Tbv2L, Tbv3L and Tbv4L are turned off.

The transistor Tbv1L controls a current path between the node QL and the transistor TqrstL. The transistor Tbv1L maintains a turn-on state and is turned off only while the voltage of the node QL is boosted, thereby blocking current between the node QL and the transistor TqrstL. Even when the voltage of the node QL is boosted, the boosting voltage of the node QL does not affect one electrode of the transistor TqrstL. Therefore, an increase in a drain-to-source voltage of the transistor TqrstL resulting from the boosting voltage of the node QL is prevented. If the drain-to-source voltage of the transistor TqrstL increases to a value equal to or greater than a critical value, a device breakdown phenomenon, so-called, a breakdown phenomenon may occur due to an overload. Thus, the transistor Tbv1L can prevent the breakdown phenomenon.

The transistor Tbv2L controls a current path between the node QL and the transistor T2L. The transistor Tbv2L maintains a turn-on state and is turned off only while the voltage of the node QL is boosted, thereby blocking current between the node QL and the transistor T2L. Even when the voltage of the node QL is boosted, the boosting voltage of the node QL does not affect one electrode of the transistor T2L. Thus, the transistor Tbv2L can prevent the breakdown phenomenon caused when a drain-to-source voltage of the transistor T2L exceeds a critical value due to the boosting voltage of the node QL.

The transistor Tbv3L controls a current path between the node QL and the transistor T3L. The transistor Tbv3L maintains a turn-on state and is turned off only while the voltage of the node QL is boosted, thereby blocking current between the node QL and the transistor T3L. Even when the voltage of the node QL is boosted, the boosting voltage of the node QL does not affect one electrode of the transistor T3L. Thus, the transistor Tbv3L can prevent the breakdown phenomenon caused when a drain-to-source voltage of the transistor T3L exceeds a critical value due to the boosting voltage of the node QL.

The transistor Tbv4L controls a current path between the node QL and the transistor T8L. The transistor Tbv4L maintains a turn-on state and is turned off only while the voltage of the node QL is boosted, thereby blocking current between the node QL and the transistor T8L. Even when the voltage of the node QL is boosted, the boosting voltage of the node QL does not affect the gate electrode of the transistor T8L. Thus, the transistor Tbv4L can prevent the breakdown phenomenon caused when a gate-to-drain voltage of the transistor T8L exceeds a critical value due to the boosting voltage of the node QL.

The transistors TqrstL, T3L, T4L, T5L and T8L may be configured in a dual gate structure, so that they can suppress a leakage current when they are turned off. In the dual gate structure, two gate electrodes are connected to each other so that they have the same voltage level. A channel length in the dual gate structure is longer than a channel length in a single gate structure. Because an increase in the channel length results in an increase in a resistance, a leakage current decreases when the transistor is turned off. Hence, the operation stability can be secured.

Figure 9:
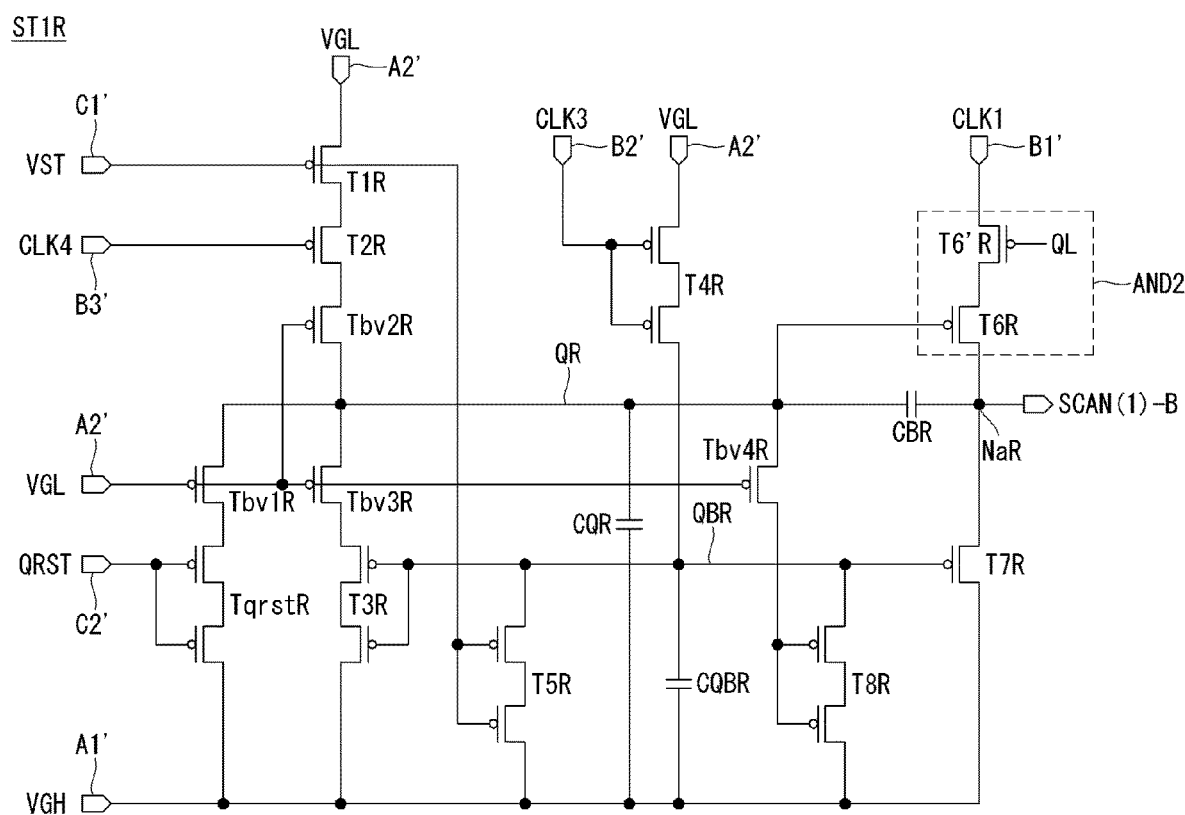
FIG. 9 illustrates configuration of a second side stage including a second output unit shown in FIG. 7, according to an embodiment of the disclosure.

FIG. 8 illustrates configuration of a second side stage including the second output unit shown in FIG. 7. The second side stage shown in FIG. 9 is the stage ST1R shown in FIG. 6. Configuration of each of the remaining second side stages ST2R, ST3R, ST4R of FIG. 6 may be substantially the same as configuration of the stage ST1R of FIG. 9, except a difference in the clock signals and the carry signal.

Referring to FIG. 9, a second side stage ST1R may include a reset unit, an output buffer, a QR controller, a QBR controller, and a deterioration reducing unit. A second output unit AND2 is included in the output buffer.

The reset unit may be implemented as a transistor TqrstR that is switched in response to the global reset signal QRST. The transistor TqrstR resets the node QR to the gate-off voltage VGH every predetermined time, thereby securing the operation stability and the operation reliability of the stage. A gate electrode of the transistor TqrstR is connected to a reset terminal C2. The global reset signal QRST of the gate-on voltage VGL may be simultaneously input to all the stages in a power-on period of an initial drive. The global reset signal QRST of the gate-on voltage VGL may be input in the initial drive before the start signal VST. When the transistor TqrstR is turned on by the global reset signal QRST of the gate-on voltage VGL, the node QR may be reset to the gate-off voltage VGH.

The output buffer may include the second output unit AND2 including second pull-up elements T6'R and T6R controlled according to the node QR and the node QR, a pull-down element T7R controlled according to a node QBR, and a boosting capacitor CBR connected to the node QR.

The second pull-up elements T6'R and T6R are transistors outputting a scan signal SCAN(1)-B of the gate-on voltage VGL to a node NaR when voltages of the node QL and the node QR are activated in response to the clock signal CLK1 and then are boosted. The second pull-up elements T6'R and T6R include the transistors T6'R and T6R that are connected in series between a clock input terminal B1 and the output node NaR. A gate electrode of the transistor T6'R is connected to the node QL, and a gate electrode of the transistor T6R is connected to the node QR.

The boosting capacitor CBR is connected between the node QR and the node NaR. When the clock signal CLK1 is inverted from the gate-off voltage VGH to the gate-on voltage VGL in a state where the voltage of the node QR is at the gate-on voltage VGL, the voltage of the node QR is reduced from the gate-on voltage VGL to a boosting voltage level lower than the gate-on voltage VGL due to a coupling effect of the boosting capacitor CBR and the node QR. Due to such a bootstrapping effect, a voltage of the node NaR is rapidly changed to the gate-on voltage VGL. The scan signal SCAN(1)-B of the gate-on voltage VGL can be rapidly output using the bootstrapping effect without the distortion or the delay.

The pull-down element T7R is a transistor outputting the scan signal SCAN(1)-B of the gate-off voltage VGH to the node NaR when the node QBR is activated. A gate electrode of the pull-down element T7R is connected to the node QBR, a first electrode of the pull-down element T7R is connected to the node NaR, and a second electrode of the pull-down element T7R is connected to a VGH power terminal A1.

The QR controller may include transistors T1R, T2R and T3R controlling the voltage of the node QR and a capacitor CQR.

The transistors T1R and T2R are connected in series between a VGL power terminal A2 and the node QR. The transistors T1R and T2R are switched in response to the start signal VST and the clock signal CLK4, each of which has a phase earlier than a phase of the clock signal CLK1, and activate the node QR to the gate-on voltage VGL. A gate electrode of the transistor T1R is connected to a start terminal C1 to which the start signal VST is input, a first electrode of the transistor T1R is connected to the VGL power terminal A2, and a second electrode of the transistor T1R is connected to a first electrode of the transistor T2R. A gate electrode of the transistor T2R is connected to a clock terminal B3 to which the clock signal CLK4 is input, the first electrode of the transistor T2R is connected to the second electrode of the transistor T1R, and a second electrode of the transistor T2R is connected to the node QR via a transistor Tbv2R.

The transistor T3R deactivates the node QR to the gate-off voltage VGH while the node QBR is activated. A gate electrode of the transistor T3R is connected to the node QBR, a first electrode of the transistor T3R is connected to the VGH power terminal A1, and a second electrode of the transistor T3R is connected to the node QR via a transistor Tbv3R.

The capacitor CQR is connected between the QR and the VGH power terminal A1 and stabilizes the voltage of the node QR while the node QR is floated.

The QBR controller may include transistors T4R, T5R and T8R controlling a voltage of the node QBR and a capacitor CQBR.

The transistor T4R is switched in response to the clock signal CLK3, of which a phase is later than the phase of the clock signal CLK1, and activates the node QBR to the gate-on voltage VGL. A gate electrode of the transistor T4R is connected to a clock terminal B2 to which the clock signal CLK3 is input, a first electrode of the transistor T4R is connected to the VGL power terminal A2, and a second electrode of the transistor T4R is connected to the node QBR.

The transistor T5R is switched in response to the start signal VST and deactivates the node QBR to the gate-off voltage VGH. A gate electrode of the transistor T5R is connected to the start terminal C1, a first electrode of the transistor T5R is connected to the VGH power terminal A1, and a second electrode of the transistor T5R is connected to the node QBR.

The transistor T8R deactivates the node QBR to the gate-off voltage VGH while the node QR is activated. A gate electrode of the transistor T8R is connected to the node QR via a transistor Tbv4R, a first electrode of the transistor T8R is connected to the VGH power terminal A1, and a second electrode of the transistor T8R is connected to the node QBR.

The capacitor CQBR is connected between the node QBR and the VGH power terminal A1 and stabilizes the voltage of the node QBR while the node QBR is floated.

The deterioration reducing unit includes transistors Tbv1R, Tbv2R, Tbv3R and Tbv4R of which gate electrodes are connected to the VGL power terminal A2. One electrode of each of the transistors Tbv1R, Tbv2R, Tbv3R and Tbv4R is connected to the node QR. The transistors Tbv1R, Tbv2R, Tbv3R and Tbv4R maintain a turn-on state due to the gate-on voltage VGL of the VGL power terminal A2. However, because a gate-to-source voltage of each of the transistors Tbv1R, Tbv2R, Tbv3R and Tbv4R is less than a threshold voltage while the voltage of the node QR is boosted, the transistors Tbv1R, Tbv2R, Tbv3R and Tbv4R are turned off.

The transistor Tbv1R controls a current path between the node QR and the transistor TqrstR. The transistor Tbv1R maintains a turn-on state and is turned off only while the voltage of the node QR is boosted, thereby blocking current between the node QR and the transistor TqrstR. Even when the voltage of the node QR is boosted, the boosting voltage of the node QR does not affect one electrode of the transistor TqrstR. Therefore, an increase in a drain-to-source voltage of the transistor TqrstR resulting from the boosting voltage of the node QR is prevented. If the drain-to-source voltage of the transistor TqrstR increases to a value equal to or greater than a critical value, a device breakdown phenomenon, so-called, a breakdown phenomenon may occur due to an overload. Thus, the transistor Tbv1R can prevent the breakdown phenomenon.

The transistor Tbv2R controls a current path between the node QR and the transistor T2R. The transistor Tbv2R maintains a turn-on state and is turned off only while the voltage of the node QR is boosted, thereby blocking current between the node QR and the transistor T2R. Even when the voltage of the node QR is boosted, the boosting voltage of the node QR does not affect one electrode of the transistor T2R. Thus, the transistor Tbv2R can prevent the breakdown phenomenon caused when a drain-to-source voltage of the transistor T2R exceeds a critical value due to the boosting voltage of the node QR.

The transistor Tbv3R controls a current path between the node QR and the transistor T3R. The transistor Tbv3R maintains a turn-on state and is turned off only while the voltage of the node QR is boosted, thereby blocking current between the node QR and the transistor T3R. Even when the voltage of the node QR is boosted, the boosting voltage of the node QR does not affect one electrode of the transistor T3R. Thus, the transistor Tbv3R can prevent the breakdown phenomenon caused when a drain-to-source voltage of the transistor T3R exceeds a critical value due to the boosting voltage of the node QR.

The transistor Tbv4R controls a current path between the node QR and the transistor T8R. The transistor Tbv4R maintains a turn-on state and is turned off only while the voltage of the node QR is boosted, thereby blocking current between the node QR and the transistor T8R. Even when the voltage of the node QR is boosted, the boosting voltage of the node QR does not affect a gate electrode of the transistor T8R. Thus, the transistor Tbv4R can prevent the breakdown phenomenon caused when a gate-to-drain voltage of the transistor T8R exceeds a critical value due to the boosting voltage of the node QR.

The transistors TqrstR, T3R, T4R, T5R and T8R may be configured in a dual gate structure, so that they can suppress a leakage current when they are turned off. In the dual gate structure, two gate electrodes are connected to each other so that they have the same voltage level. A channel length in the dual gate structure is longer than a channel length in a single gate structure. Because an increase in the channel length results in an increase in a resistance, a leakage current decreases when the transistor is turned off. Hence, the operation stability can be secured.

Figure 10:
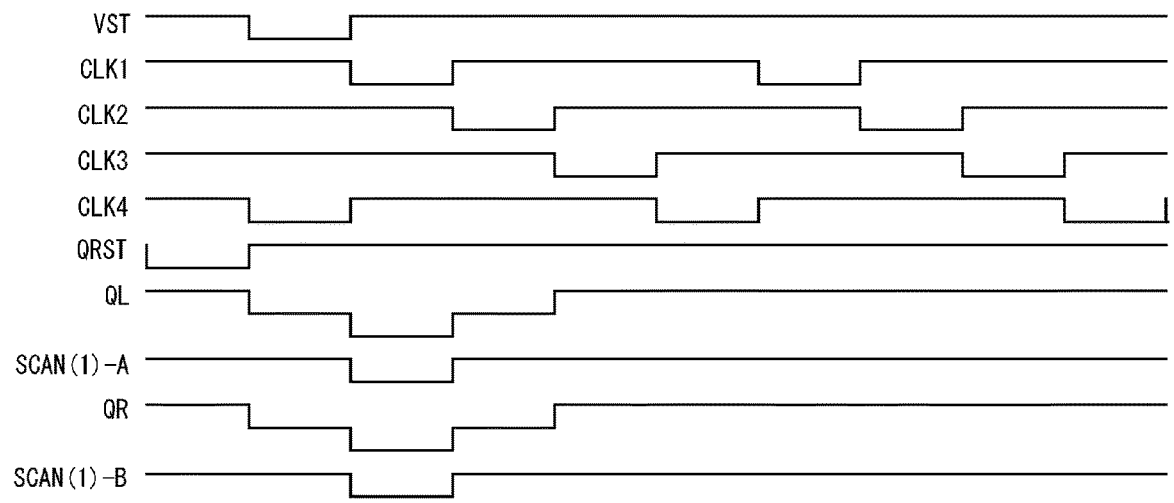
FIG. 10 illustrates changes in voltages of nodes QL and QR and scan signals when stages of FIGS. 8 and 9 operate normally, according to an embodiment of the disclosure.
Figure 11:
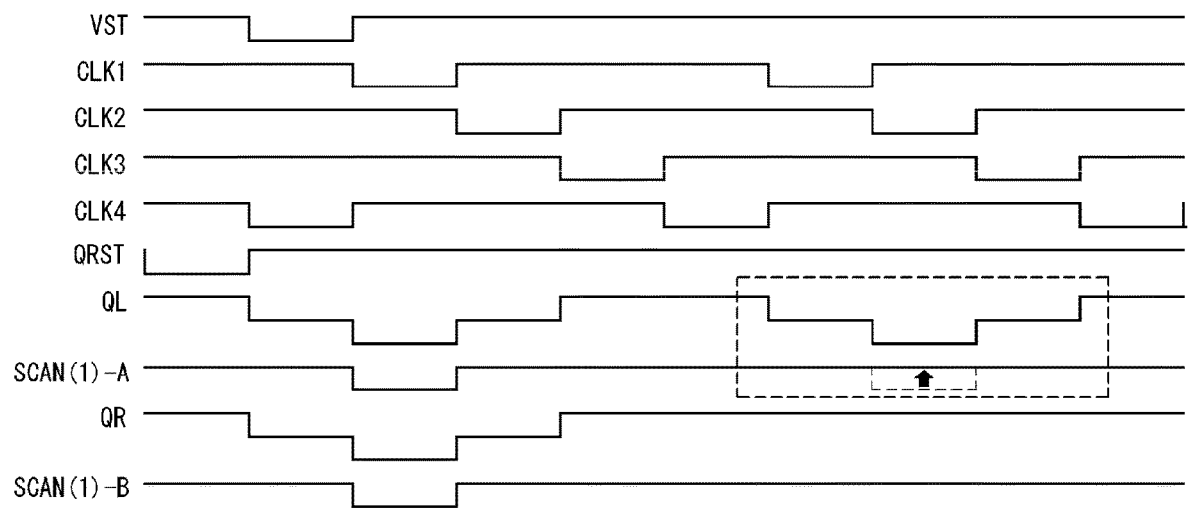
FIG. 11 illustrates changes in voltages of nodes QL and QR and scan signals when stages of FIGS. 8 and 9 operate abnormally, according to an embodiment of the disclosure.

FIG. 10 illustrates changes in voltages of nodes QL and QR and scan signals when stages of FIGS. 8 and 9 operate normally. FIG. 11 illustrates changes in voltages of nodes QL and QR and scan signals when stages of FIGS. 8 and 9 operate abnormally.

The nodes QL and QR of the first side stage and the second side stage (i.e., both side stages) shown in FIGS. 8 and 9 are activated once per frame when the nodes QL and QR operates normally. While the nodes QL and QR are activated, bootstrapping occurs in synchronization with the clock signal CLK1, and the scan signals SCAN(1)-A/B of the same phase are output to both side stages.

On the other hand, when one of the nodes QL and QR of both side stages shown in FIGS. 8 and 9 operates abnormally, the node with the problem may be activated two or more times in one frame. For example, as shown in FIG. 11, the node QL may be activated twice in one frame. Such an abnormal operation is generated because the transistors connected to the nodes QL and QR are deteriorated depending on a temperature, driving conditions, and the like.

According to embodiments of the disclosure, each of the first and second output units AND1 and AND2 is connected to both the nodes QL and QR so that they are controlled by all the nodes QL and QR. Therefore, even if one of the nodes QL and QR operates abnormally, the both side stages can normally output the scan signals SCAN(1)-A/B. Namely, as indicated by a dotted line of FIG. 11, even if the node QL is abnormally activated and bootstrapped, the node QR can maintain a normal state (i.e., a deactivation state) during a period in which the node QL is abnormally activated and bootstrapped. Hence, a scan signal SCAN(1)-A output from the first side stage can maintain a normal state (i.e., the gate-off voltage VGH). As described above, embodiments of the disclosure can prevent an abnormal output resulting from the abnormal activation of a node Q one of both side stages by changing connection configuration of the output units even when the node Q of one of both side stages is abnormally activated.

Figure 12:
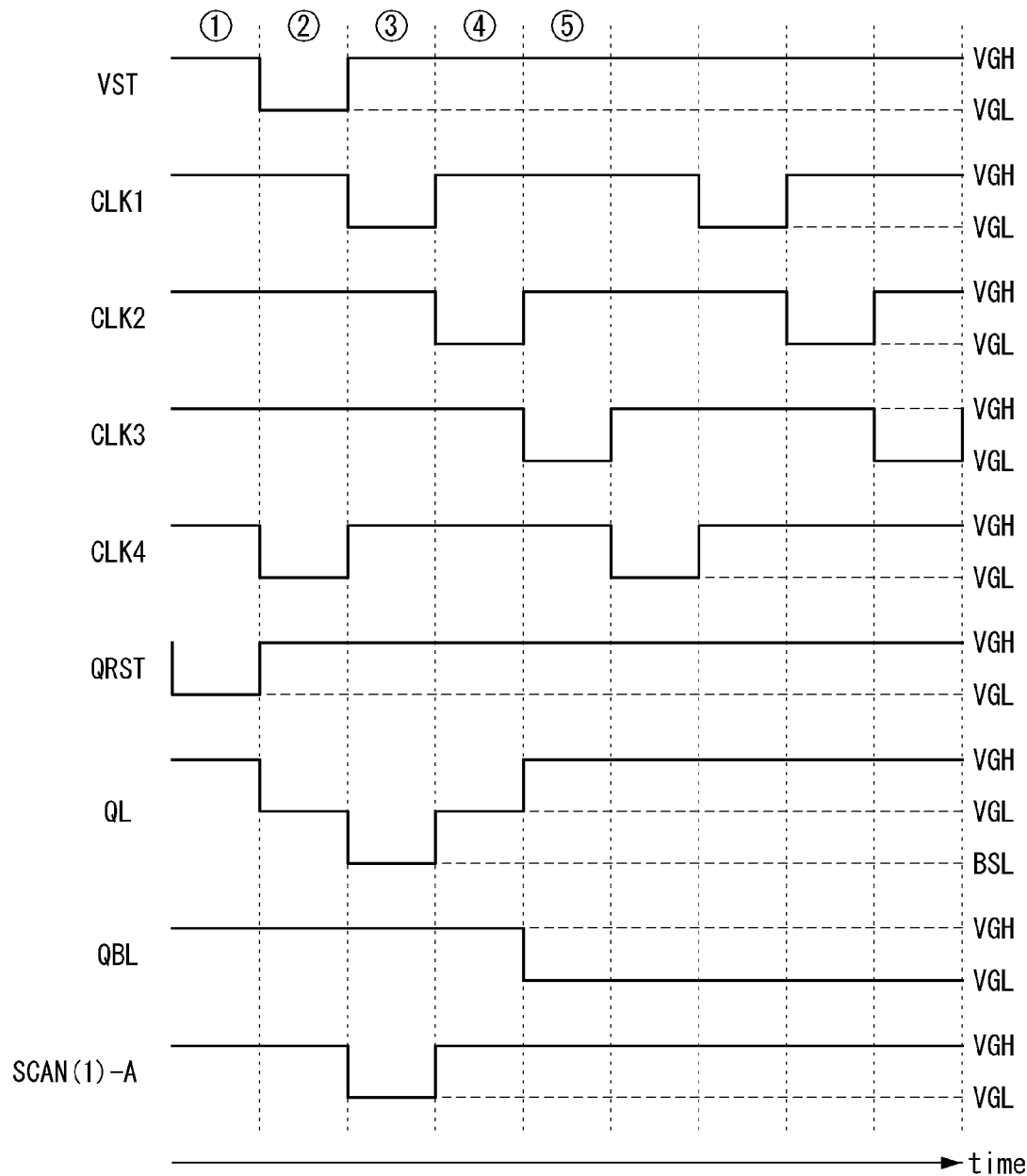
FIG. 12 illustrates an operation waveform of a first side stage shown in FIG. 8, according to an embodiment of the disclosure.

FIG. 12 illustrates an operation waveform of a first side stage shown in FIG. 8. FIGS. 13A to 13E illustrate operation states of a stage respectively corresponding to periods ① to ⑤ shown in FIG. 12. Since an operation of the second side stage shown in FIG. 9 is substantially the same as an operation of the first side stage shown in FIG. 8, a brief description thereof will be made.

Figure 13A:
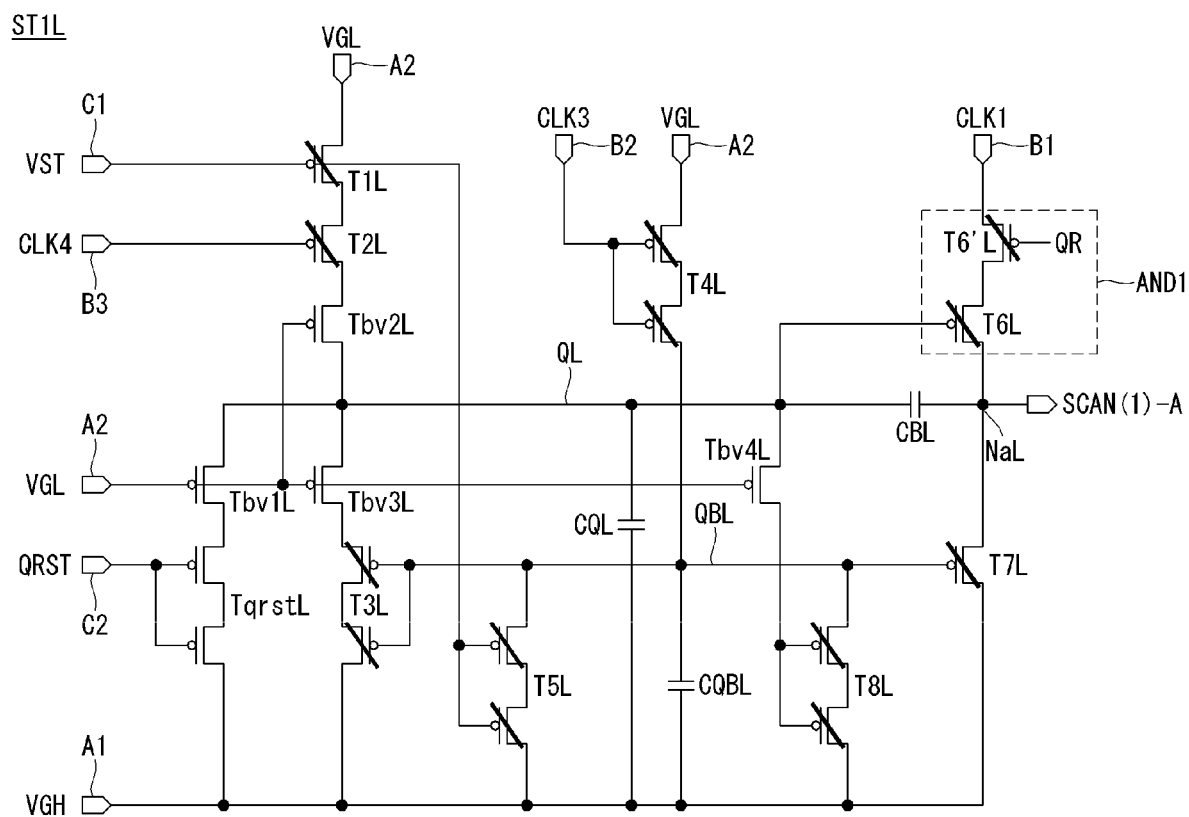
FIGS. 13A to 13E illustrate operation states of a stage respectively corresponding to periods ① to ⑤ shown in FIG. 12, according to an embodiment of the disclosure.

Referring to FIGS. 12 and 13A, in the period ①, the start signal VST and the clock signals CLK1 to CLK4 are input at the gate-off voltage VGH, and the global reset signal QRST is input at the gate-on voltage VGL.

In the period ①, the transistors T1L and T5L are turned off in response to the start signal VST of the gate-off voltage VGH. Further, the transistor T4L is turned off in response to the clock signal CLK3 of the gate-off voltage VGH, and the transistor T2L is turned off in response to the clock signal CLK4 of the gate-off voltage VGH.

In the period ①, the transistor TqrstL is turned on in response to the global reset signal QRST of the gate-on voltage VGL, and the node QL is reset to the gate-off voltage VGH. Further, the transistors T6L and T8L are turned off by the node QL of the gate-off voltage VGH. In the period ①, the node QR is reset to the gate-off voltage VGH. Thus, the transistor T6'L is turned off by the node QR.

In the period ①, the voltage of the node QBL is held at the gate-off voltage VGH. The transistors T3L and T7L are turned off by the node QBL of the gate-off voltage VGH.

In the period ①, the transistors Tbv1L to Tbv4L maintain an on-state.

Thus, in the period ①, the scan signal SCAN(1)-A is held at the gate-off voltage VGH of an immediately previous frame.

Figure 13B:
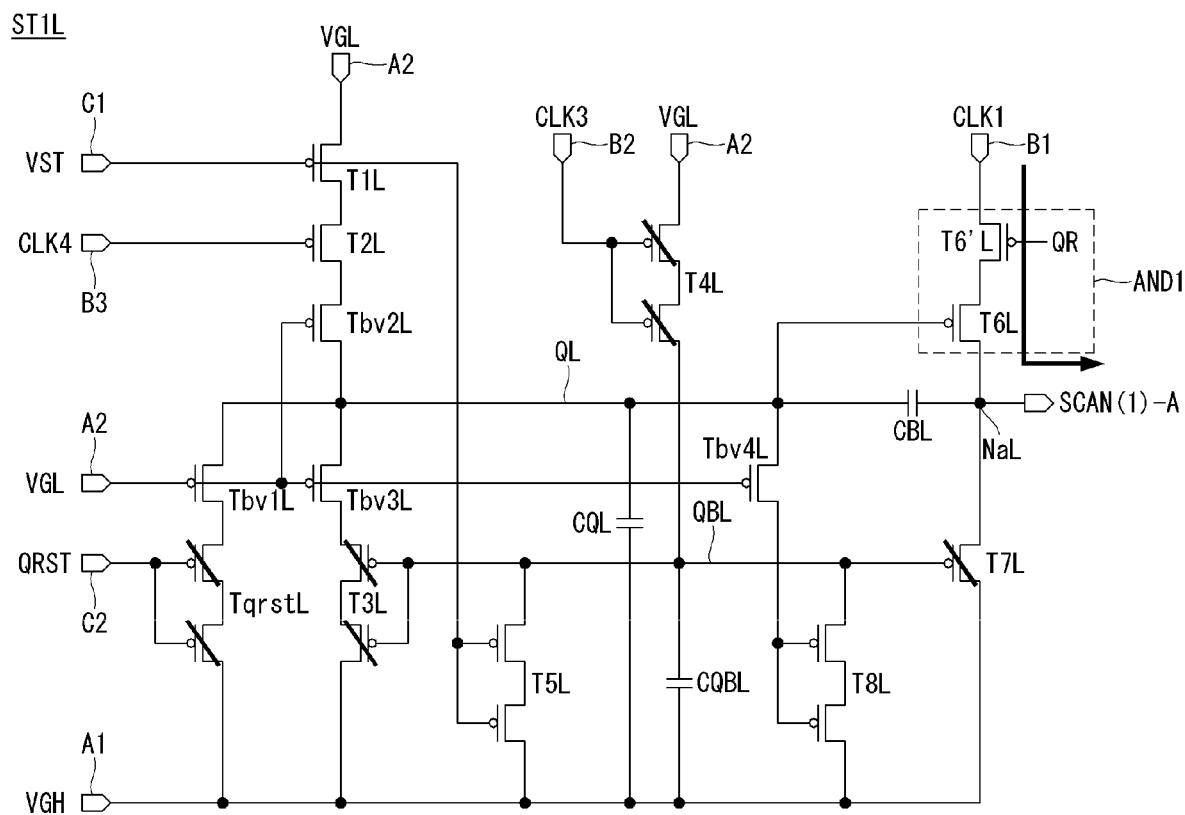

Referring to FIGS. 12 and 13B, in the period ②, the start signal VST and the clock signal CLK4 are input at the gate-on voltage VGL, and the clock signals CLK1, CLK2 and CLK3 and the global reset signal QRST are input at the gate-off voltage VGH.

In the period ②, the transistors T1L and T5L are turned on in response to the start signal VST of the gate-on voltage VGL, and the transistor T2L is turned on in response to the clock signal CLK4 of the gate-on voltage VGL. Further, the transistor T4L maintains an off-state in response to the clock signal CLK3 of the gate-off voltage VGH.

In the period ②, the transistors Tbv1L to Tbv4L maintain an on-state.

In the period ②, the transistors T1L and T2L are turned on in response to the start signal VST of the gate-on voltage VGL and the clock signal CLK4 of the gate-on voltage VGL, and the node QL is activated to the gate-on voltage VGL. The transistors T6L and T8L are turned on by the gate-on voltage VGL of the node QL. In this instance, the node QR is activated to the gate-on voltage VGL. Thus, the clock signal CLK1 of the gate-off voltage VGH as the scan signal SCAN(1)-A is output to the node NaL by the turn-on of the transistors T6L and T6'L.

In the period ②, the transistor T8L is turned on by the gate-on voltage VGL of the node QL, the transistors T1L and T5L are turned on in response to the start signal VST of the gate-on voltage VGL, and the transistor T4L maintains the off-state in response to the clock signal CLK3 of the gate-off voltage VGH. As a result, the node QBL is held at the gate-off voltage VGH, and the transistor T7L maintains an off-state. Further, the transistor T3L maintains an off-state by the gate-off voltage VGH of the node QBL.

Figure 13C:
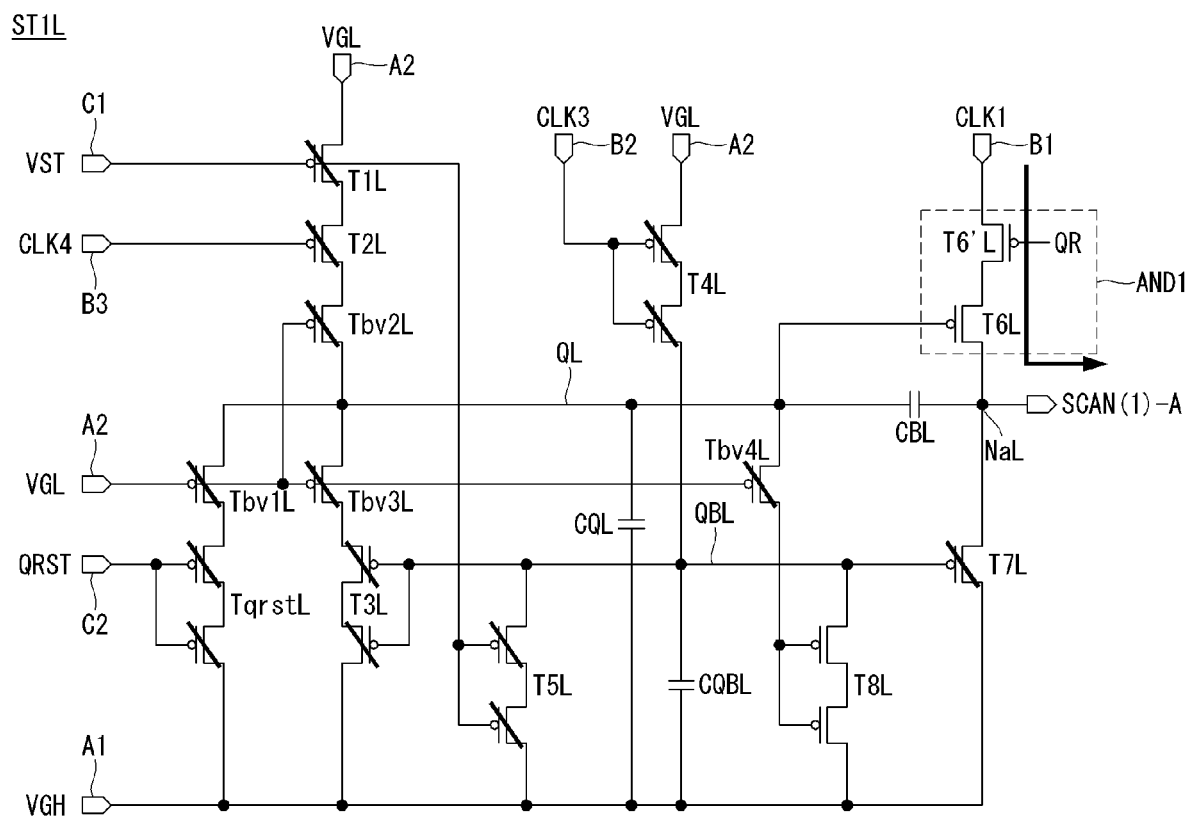

Referring to FIGS. 12 and 13C, in the period ③, the clock signal CLK1 is input at the gate-on voltage VGL, and the clock signals CLK2, CLK3 and CLK4, the start signal VST, and the global reset signal QRST are input at the gate-off voltage VGH.

In the period ③, the transistors T1L and T5L are turned off in response to the start signal VST of the gate-off voltage VGH, and the transistor T2L is turned off in response to the clock signal CLK4 of the gate-off voltage VGH. Further, the transistor T4L maintains an off-state in response to the clock signal CLK3 of the gate-off voltage VGH.

In the period ③, the node QL and the node QR are floated, and the clock signal CLK1 is inverted from the gate-off voltage VGH to the gate-on voltage VGL and is input to the clock terminal B1. When voltages of the clock terminals B1 and B1' are reduced from the gate-off voltage VGH to the gate-on voltage VGL due to a coupling effect of a parasitic capacitor between the clock terminal B1 and the node QL and a parasitic capacitor between the clock terminal B1' and the node QR, the voltages of the nodes QL and QR are reduced from the gate-on voltage VGL to a boosting voltage BSL. As a result, the clock signal CLK1 of the gate-on voltage VGL is charged to the node NaL through the transistors T6L and T6'L without the delay and/or the distortion. In other words, the scan signal SCAN(1)-A of the gate-on voltage VGL is rapidly output to the node NaL.

In the period ③, as the voltage of the node QL is reduced from the gate-on voltage VGL to the boosting voltage BSL, the transistors Tbv1L to Tbv4L are turned off. While the voltage of the node QL is boosted, the transistors Tbv1L to Tbv4L are turned off and block an overload from being applied to the transistors TqrstL, T2L, T3L and T8L.

In the period ③, the gate electrode of the transistor T8L is floated, and the transistor T8L maintains an on-state. The transistor T4L maintains an off-state in response to the clock signal CLK3 of the gate-off voltage VGH. As a result, the node QBL is held at the gate-off voltage VGH, and the transistor T7L maintains an off-state. Further, the transistor T3L maintains an off-state by the node QBL of the gate-off voltage VGH.

Figure 13D:
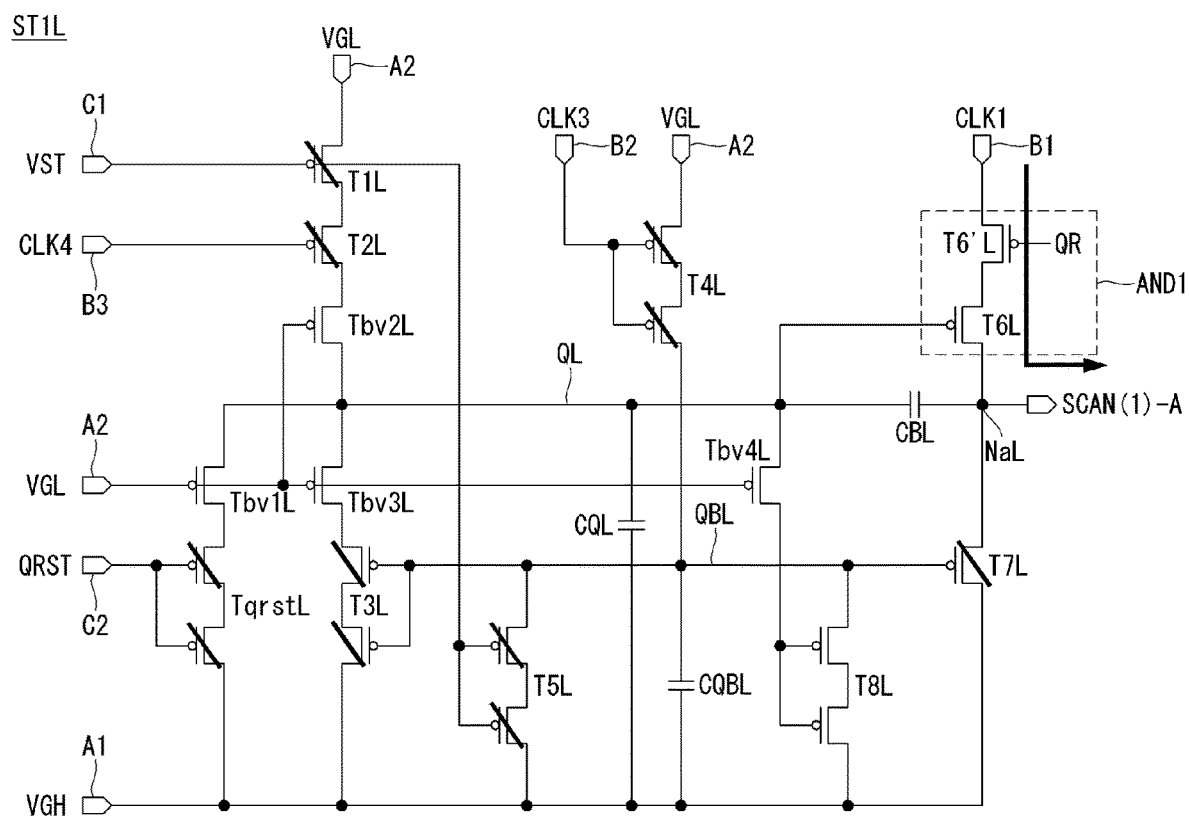

Referring to FIGS. 12 and 13D, in the period ④, the clock signal CLK2 is input at the gate-on voltage VGL, and the clock signals CLK1, CLK3 and CLK4, the start signal VST, and the global reset signal QRST are input at the gate-off voltage VGH.

In the period ④, the transistors T1L and T5L maintain an off-state in response to the start signal VST of the gate-off voltage VGH, and the transistor T2L maintains an off-state in response to the clock signal CLK4 of the gate-off voltage VGH. Further, the transistor T4L maintains an off-state in response to the clock signal CLK3 of the gate-off voltage VGH.

In the period ④, the node QL is floated. When the voltage of the clock terminal B1 increases from the gate-on voltage VGL to the gate-off voltage VGH, the voltage of the node QL increases from the boosting voltage BSL to the gate-on voltage VGL. Further, the transistors Tbv1L to Tbv4L and T8L are turned on, and the transistors T3L and T7L are turned off. The transistors T6L and T6'L maintain an on-state. As a result, the clock signal CLK1 of the gate-off voltage VGH as the scan signal SCAN(1)-A is output to the node NaL through the transistors T6L and T6'L.

Figure 13E:
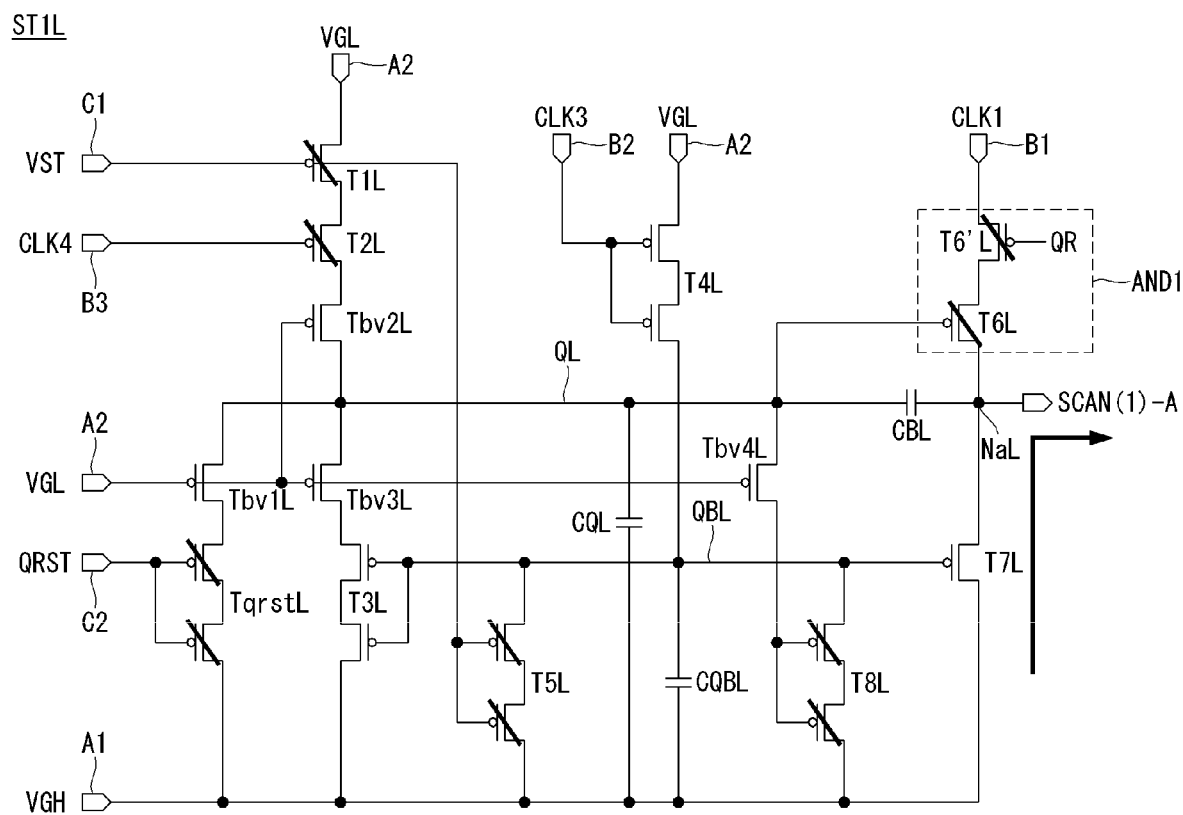

Referring to FIGS. 12 and 13E, in the period ⑤, the clock signal CLK3 is input at the gate-on voltage VGL, and the clock signals CLK1, CLK2 and CLK4, the start signal VST, and the global reset signal QRST are input at the gate-off voltage VGH.

In the period ⑤, the transistors T1L and T5L maintain an off-state in response to the start signal VST of the gate-off voltage VGH, and the transistor T2L maintains an off-state in response to the clock signal CLK4 of the gate-off voltage VGH. Further, the transistor T4L is turned on in response to the clock signal CLK3 of the gate-on voltage VGL.

In the period ⑤, the gate-on voltage VGL is again applied to the node QBL by the turn-on of the transistor T4L. The transistors T7L and T3L are turned on by the node QBL of the gate-on voltage VGL. As a result, the scan signal SCAN(1)-A of the gate-off voltage VGH is output to the node NaL through the transistor T7L, and the gate-off voltage VGH is again applied to the node QL through the transistor T3L.

In the period ⑤, the voltage of the node QL is inverted to the gate-off voltage VGH, and the transistors Tbv1L to Tbv4L maintain an on-state. Further, the transistor T6L is turned off by the node QL of the gate-off voltage VGH.

As described above, the embodiments of the disclosure connect each of the first and second output units of both side stages of the double bank structure to both the nodes QL and QR, so that the first and second output units are controlled by all the nodes QL and QR. Hence, the embodiments of the disclosure can prevent both side stages from abnormally outputting the scan signal even if one of the nodes QL and QR operates abnormally. In other words, the embodiments of the disclosure can prevent an abnormal output resulting from the abnormal activation of a node Q by changing the connection configuration of the output units even when the node Q of one of both side stages is abnormally activated.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate driver comprising:
a first stage including a node QL and a first output unit, the first stage configured to output a scan signal A; and
a second stage including a node QR and a second output unit, the second stage configured to output a scan signal B having the same phase as the scan signal A,
wherein the first output unit includes a first transistor having a gate electrode connected to the node QL and a second transistor having a gate electrode connected to the node QR, and
wherein the second output unit includes a third transistor having a gate electrode connected to the node QR and a fourth transistor having a gate electrode connected to the node QL.

2. The gate driver of claim 1, wherein the first stage and the second stage are connected to a gate line of a display panel,
wherein the first stage is configured to output the scan signal A to the gate line, and the second stage is configured to output the scan signal B to the gate line.

3. The gate driver of claim 1, wherein the first output unit is configured to output the scan signal A at a gate-on voltage while both the node QL and the node QR are activated, and the second output unit is configured to output the scan signal B at the gate-on voltage while both the node QL and the node QR are activated.

4. The gate driver of claim 3, wherein while at least one of the node QL and the node QR is deactivated, the first output unit is configured to output a gate-off voltage for the scan signal A, and while at least one of the node QL and the node QR is deactivated, the second output unit is configured to output the gate-off voltage for the scan signal B.

5. The gate driver of claim 1, wherein the first transistor and the second transistor are electrically connected to each other between a first clock input terminal and a first output node.

6. The gate driver of claim 5, wherein the first transistor and the second transistor are connected in series.

7. The gate driver of claim 5, wherein clock signals of the same phase are applied to the first clock input terminal and the second output unit.

8. The gate driver of claim 1, wherein the third transistor and the fourth transistor are electrically connected to each other between a second clock input terminal and a second output node.

9. The gate driver of claim 8, wherein the third transistor and the fourth transistor are connected in series.

10. The gate driver of claim 8, wherein clock signals of the same phase are applied to the first clock input terminal and the second output unit.

11. A display device comprising:
a display panel including first gate lines and second gate lines connected to pixels;
a first scan driver connected to the first gate lines with a first scan signal of a first phase generated in the first stage and the second stage according to claim 1; and
a second scan driver connected to the second gate lines with a second scan signal of a second phase generated in the first stage and the second stage according to claim 1.

12. The display device of claim 11, wherein each pixel includes a light emitting element and a driving element,
wherein during an initialization period in which a specific node of the pixels is initialized, the first scan signal is output at a gate-off voltage, and the second scan signal is output at a gate-on voltage,
wherein during a sampling period in which a threshold voltage of the driving element is sampled and compensated subsequent to the initialization period, the first scan signal and the second scan signal are output at the gate-on voltage,
wherein during an emission period in which the light emitting element is driven subsequent to the sampling period, the first scan signal and the second scan signal are output at the gate-off voltage.

* * * * *